(12) United States Patent
Cooper

(10) Patent No.: US 6,426,711 B1
(45) Date of Patent: Jul. 30, 2002

(54) CHARACTER TABLE IMPLEMENTED DATA COMPRESSION METHOD AND APPARATUS

(75) Inventor: Albert B. Cooper, New York, NY (US)

(73) Assignee: Unisys Corporation, Blue Bell, PA (US)

( * ) Notice: Subject to any disclaimer, the term of this patent is extended or adjusted under 35 U.S.C. 154(b) by 0 days.

(21) Appl. No.: 09/855,127

(22) Filed: May 14, 2001

(51) Int. Cl.[7] .................................................. H03M 7/30
(52) U.S. Cl. ............................. 341/87; 341/51; 341/67; 341/106
(58) Field of Search ............................. 341/51, 67, 87, 341/106

(56) References Cited

U.S. PATENT DOCUMENTS

| | | | |
|---|---|---|---|
| 4,558,302 A | * 12/1985 | Welch | 340/347 |
| 4,814,746 A | * 3/1989 | Miller et al. | 341/95 |
| 5,153,591 A | * 10/1992 | Clark | 341/51 |
| B1 4,558,302 A | 1/1994 | Welch | 341/51 |
| 5,442,350 A | * 8/1995 | Iyer et al. | 341/106 |
| 5,455,576 A | * 10/1995 | Clark et al. | 341/50 |
| 5,838,264 A | * 11/1998 | Cooper | 341/106 |
| 6,169,499 B1 | * 1/2001 | Cooper | 341/51 |
| 6,188,333 B1 | * 2/2001 | Cooper | 341/51 |
| 6,307,488 B1 | * 10/2001 | Cooper | 341/51 |

* cited by examiner

Primary Examiner—Michael Tokar
Assistant Examiner—Khai Nguyen
(74) Attorney, Agent, or Firm—Albert B. Cooper; Lise A. Rode; Michael B. Atlass

(57) ABSTRACT

A new LZW compressor implementation architecture utilizes a plurality of character tables corresponding to the respective characters of the alphabet. A string is stored by storing the code associated with the string in the character table corresponding to the extension character of the string at a character table location corresponding to the code of the string prefix. A search for the longest matching string is performed by determining if the character table location is empty corresponding to the code of the currently matched string in the character table associated with the currently fetched character. If the location is not empty, it is storing the code of the string comprising the currently matched string extended by the currently fetched character. This string code is used as the next match with which to continue the search with the next fetched character. When the location is empty, the longest match has been determined to be the currently matched string. The stored strings are updated by storing the next available string code in the empty location.

42 Claims, 8 Drawing Sheets

INPUT DATA CHARACTER STREAM $a_1$ $b_1$ $a_2$ $b_2$ $a_3$ $b_3$ $a_4$ $b_4$ $c_1$ $a_5$ $b_5$ $c_2$ $a_6$ $b_6$ $c_3$ $a_7$ $b_7$ $c_4$ $d_1$

| ACTION | CURR MATCH | CURR CHAR | CODE CNTR | CHAR TABLE | INDEX (PREFIX) | STRING CODE | OUTPUT | BLOCK OF FIG. 2 |
|---|---|---|---|---|---|---|---|---|
| 1  | $a_1$ | $b_1$ | 258 | b | a   | 258   | $a_1$ | 50-57,70,71 |
| 2  | $b_1$ | $a_2$ | 259 | a | b   | 259   | $b_1$ | 72-75,54-57,70,71 |
| 3  | $a_2$ | $b_2$ | 260 | b | a   | (258) |       | 72-75,54-57 |
| 4  | 258   | $a_3$ |     | a | 258 | 260   | 258   | 58,54-57,70,71 |
| 5  | $a_3$ | $b_3$ | 261 | b | a   | (258) |       | 72-75,54-57 |
| 6  | 258   | $a_4$ |     | a | 258 | (260) |       | 58,54-57 |
| 7  | 260   | $b_4$ |     | b | 260 | 261   | 260   | 58,54-57,70,71 |
| 8  | $b_4$ | $c_1$ | 262 | c | b   | 262   | $b_4$ | 72-75,54-57,70,71 |
| 9  | $c_1$ | $a_5$ | 263 | a | c   | 263   | $c_1$ | 72-75,54-57,70,71 |
| 10 | $a_5$ | $b_5$ | 264 | b | a   | (258) |       | 72-75,54-57 |
| 11 | 258   | $c_2$ |     | c | 258 | 264   | 258   | 58,54-57,70,71 |
| 12 | $c_2$ | $a_6$ | 265 | a | c   | (263) |       | 72-75,54-57 |
| 13 | 263   | $b_6$ |     | b | 263 | 265   | 263   | 58,54-57,70,71 |
| 14 | $b_6$ | $c_3$ | 266 | c | b   | (262) |       | 72-75,54-57 |
| 15 | 262   | $a_7$ |     | a | 262 | 266   | 262   | 58,54-57,70,71 |
| 16 | $a_7$ | $b_7$ | 267 | b | a   | (258) |       | 72-75,54-57 |
| 17 | 258   | $c_4$ |     | c | 258 | (264) |       | 58,54-57 |
| 18 | 264   | $d_1$ |     | d | 264 | 267   | 264   | 58,54-57,70,71 |
| 19 | $d_1$ | ..    | 268 | . | ... | ...   | $d_1$ | 72-75,54,71,END |

*Figure 3*

CHARACTER TABLE IMPLEMENTED DATA COMPRESSION METHOD AND APPARATUS

BACKGROUND OF THE INVENTION

1. Field of the Invention

The invention relates to LZ data compression systems particularly with respect to the LZW compression methodology. More particularly, the invention relates to the architecture and protocols for storing and accessing data character strings in the compressor.

2. Description of the Prior Art

Professors Abraham Lempel and Jacob Ziv provided the theoretical basis for LZ data compression and decompression systems that are in present day widespread usage. Two of their seminal papers appear in the IEEE Transactions on Information Theory, IT-23-3, May 1977, pp. 337–343 and in the IEEE Transactions on Information Theory, IT-24-5, September 1978, pp. 530–536. A ubiquitously used data compression and decompression system known as LZW, adopted as the standard for V.42 bis modem compression and decompression, is described in U.S. Pat. No. 4,558,302 by Welch, issued Dec. 10, 1985. LZW has been adopted as the compression and decompression standard used in the GIF image communication protocol and is utilized in the TIFF image communication protocol. GIF is a development of CompuServe Incorporated and the name GIF is a Service Mark thereof. A reference to the GIF specification is found in GRAPHICS INTERCHANGE FORMAT, Version 89a, Jul. 31, 1990. TIFF is a development of Aldus Corporation and the name TIFF is a Trademark thereof. Reference to the TIFF specification is found in TIFF, Revision 6.0, Final—Jun. 3, 1992.

Further examples of LZ dictionary based compression and decompression systems are described in the following U.S. patents: U.S. Pat. No. 4,464,650 by Eastman et al., issued Aug. 7, 1984; U.S. Pat. No. 4,814,746 by Miller et al., issued Mar. 21, 1989; U.S. Pat. No. 4,876,541 by Storer, issued Oct. 24, 1989; U.S. Pat. No. 5,153,591 by Clark, issued Oct. 6, 1992; U.S. Pat. No. 5,373,290 by Lempel et al., issued Dec. 13, 1994; U.S. Pat. No. 5,838,264 by Cooper, issued Nov. 17, 1998; and U.S. Pat. No. 5,861,827 by Welch et al., issued Jan. 19, 1999.

In the above dictionary based LZ compression and decompression systems, the compressor and decompressor dictionaries may be initialized with all of the single character strings of the character alphabet. In some implementations, the single character strings are considered as recognized although not explicitly stored. In such systems the value of the single character may be utilized as its code and the first available code utilized for multiple character strings would have a value greater than the single character values. In this way the decompressor can distinguish between a single character string and a multiple character string and recover the characters thereof. For example, in the ASCII environment, the alphabet has an 8 bit character size supporting an alphabet of 256 characters. Thus, the characters have values of 0–255. The first available multiple character string code can, for example, be 258 where the codes 256 and 257 are utilized as control codes as is well known.

In the prior art dictionary based LZ compression systems, data character strings are stored and accessed in the compressor dictionary utilizing well known searchtree architectures and protocols. Typically, the searchtree is arranged in nodes where each node represents a character, and a string of characters is represented by a node-to-node path through the tree. When the input character stream has been matched in the dictionary tree up to a matched node, a next input character is fetched to determine if the string match will continue. Conventionally, a determination is made to ascertain if the fetched character is already stored as an extension node of the matched node. Various techniques are utilized to effect this determination such as hashing and sibling lists as are well understood in the art.

Although the known dictionary architecture and protocols provide efficient data compression systems, it is a continuing objective in the art to improve compressor performance.

SUMMARY OF THE INVENTION

The present invention provides a new string storage and access architecture and protocols which, it is believed, will improve the performance of LZ type data compression algorithms.

In the present invention a plurality of character tables corresponding to the respective characters of the alphabet are utilized instead of the conventional searchtree structured dictionary. A string is stored by storing the code associated with the string in the character table corresponding to the extension character of the string at a character table location corresponding to the code of the string prefix. The input data character stream is compared to the stored strings by determining if the table location corresponding to the code of the currently matched string in the character table associated with the currently fetched character is empty. If the location is not empty it is storing the code of the string comprising the currently matched string extended by the currently fetched character. This string code is utilized as the next match with which to continue the search with the next fetched character. If, however, the location is empty, the longest match has been determined to be the currently matched string, and the code thereof is output. The stored strings are updated by storing the next available string code in the empty location. The current character utilized to select the character table in which the empty location was encountered is the mismatching character that caused the string matching process to terminate at the longest match. In an LZW embodiment, the mismatching character is utilized to begin the next string search by using this character as the initial current match for the new string.

An alternative embodiment of the invention includes creating a character table when the character corresponding thereto is first encountered in the input.

A still further embodiment involves storing the code of the string prefix together with the code of the string at a character table location and creating the table locations as update extended strings are encountered.

The present invention provides a new implementation architecture for data compression algorithms, such as LZW, that is believed will result in significant advantages such as enhanced speed and performance.

BRIEF DESCRIPTION OF THE DRAWINGS

FIG. 3 is a chart exemplifying the operations of the compressor of FIG. 1 in accordance with the control flow chart of FIG. 2.

DESCRIPTION OF THE PREFERRED EMBODIMENTS

The best mode embodiments described below, utilizing the Character Table implementation architecture of the present invention, are predicated, generally, on the LZW methodology. The embodiments utilize an implementation feature similar to that described above where the single character strings are considered as recognized by the compressor although not explicitly initialized therein.

Figure 1:
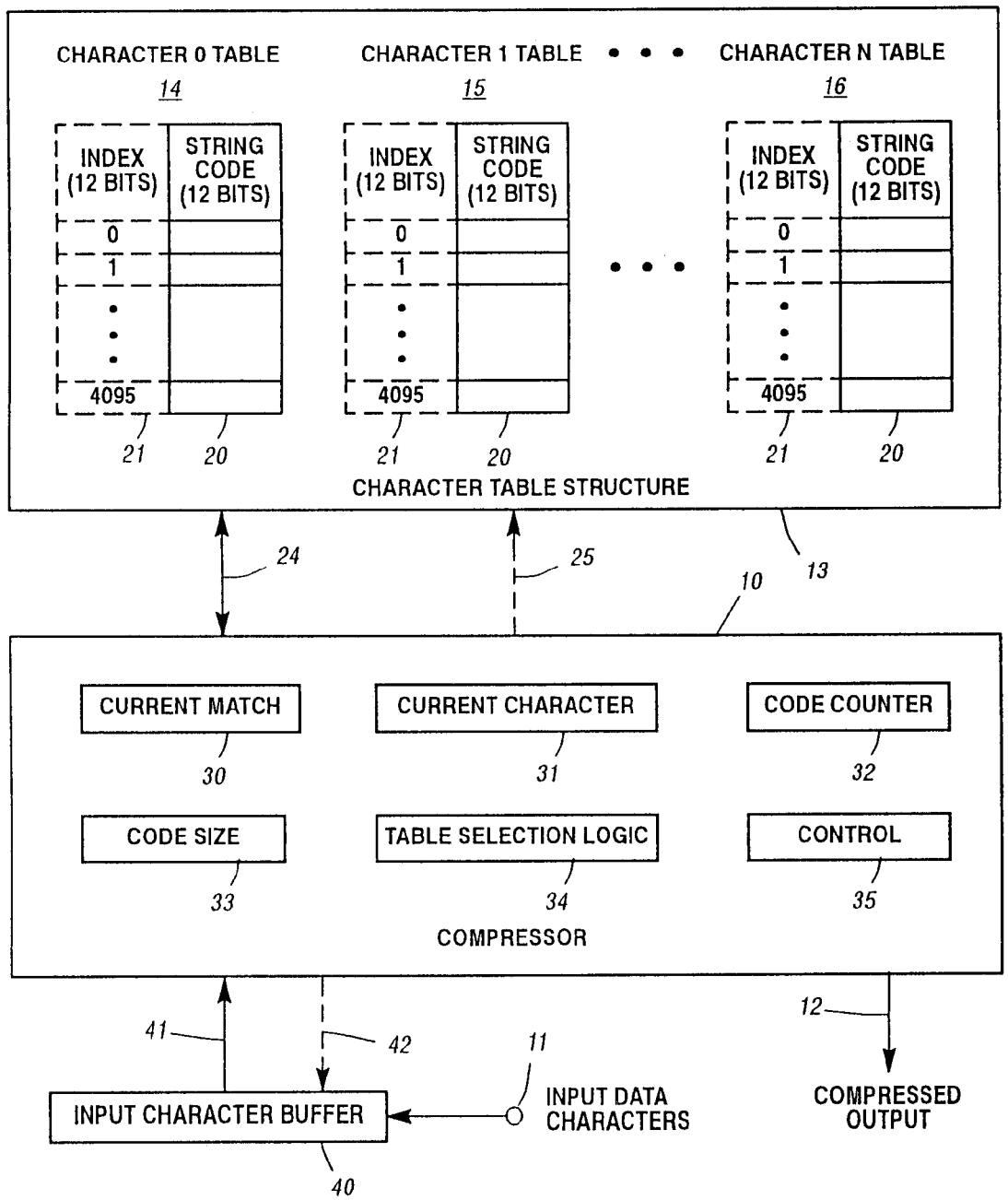
FIG. 1 is a schematic block diagram of a data compressor for compressing data in accordance with the present invention. In the embodiment of FIG. 1 the Character Tables are pre-established. The data compressor of FIG. 1 is particularly suitable for implementation as a software embodiment.

Referring to FIG. 1, a data compressor 10 is illustrated that compresses a stream of input data characters applied at an input 11 into a stream of corresponding compressed codes at an output 12. Included, in accordance with the invention, is Character Table Structure 13 comprising Character Tables 14–16 corresponding to the respective data characters of the alphabet over which compression is being performed. Each of the Character Tables 14–16 is comprised of a plurality of Table locations 20 for storing the respective string codes of data character strings stored in the Character Table Structure 13. The Table locations 20 of the Character Tables 14–16 are accessed by respective Indices 21.

A data character string is comprised of a prefix string of one or more characters followed by an extension character. A string is stored in the Character Table Structure 13 by storing the string code associated with the string in the Character Table 14–16 corresponding to the extension character of the string at a Character Table location 20 corresponding to the code of the string prefix. The prefix code is utilized as the Index 21. Data is communicated between the compressor 10 and the Character Table Structure 13 via a bi-directional data bus 24 under control of a control bus 25.

In typical LZW data compressors, the dictionary is limited to 4096 string codes. When this limitation is applied to the present invention, the prefix code Indices 21 and String Code locations 20 will each be 12 bits wide with the Indices 21 ranging from 0 through 4095 as indicated. It is appreciated that when accounting for control codes, the Indices and Table locations corresponding to the control codes are not utilized. It is furthermore appreciated that with an N character alphabet, the first N Indices of each Character Table 14–16 correspond to the N respective characters. The first N Table locations are indexed by the respective character values. For example, in the ASCII environment the alphabet has an 8 bit character size supporting an alphabet of 256 characters having values of 0–255. The first available multiple character string code may, for example, be 258 where the codes 256 and 257 are utilized as control codes.

The compressor 10 includes a Current Match register 30, a Current Character register 31, a Code Counter 32 and a Code Size register 33. The Code Counter 32 sequentially generates code values to be assigned to data character strings stored in the Character Table Structure 13 in a manner to be described. The Code Size register 33 is utilized, as is well known, to control the number of bits utilized for transmitting the compressed code from the output 12. Also included is table selection logic 34 for selecting the appropriate Character Table 14–16 in accordance with Current Character in a manner to be explained. The compressor 10 additionally includes control 35 for controlling the operations of the compressor 10 in accordance with the operational flow chart of FIG. 2 to be described below.

Further included is an Input Character Buffer 40 that buffers the input data character stream received at the input 11. The input data characters are applied from the Input Character Buffer 40 via a bus 41 to the Current Character register 31 and the Current Match register 30 in accordance with operations to be described. The compressor 10 controls acquiring input data characters from the Input Character Buffer 40 via a control bus 42.

Briefly, the operation of the compressor 10 is as follows. The compressor 10 is initialized by setting the Code Counter 32 to the first available multiple character string code and by setting the Code Size register 33 to the initial Code Size. Additionally, the Current Match register 30 is cleared and the Character Tables 14–16 are cleared to empty. A first input data character is fetched to the Current Match register 30 to initiate a compression cycle. To begin a subsequent compression cycle, the Current Match register 30 is set to contain the mismatching character determined from the preceding compression cycle.

At the beginning of a compression cycle, the next data character is fetched to the Current Character register 31. The Character Table 14–16 corresponding to Current Character is selected and the location corresponding to Current Match in the selected Character Table is accessed by Current Match utilizing the Indices 21. If the accessed location is not empty, the Current Match register 30 is set to the string code contained in the accessed location. The fetching of the next Current Character, the selection of the Character Table corresponding to Current Character and the accessing of the location corresponding to Current Match in the selected Character Table continues until the accessed location is empty.

When the accessed location is empty, the code in the Code Counter 32 is stored in the empty location and the code in the Current Match register 30 is output as the longest match. The Current Match register 30 is set to the mismatching character in the Current Character register 31 and the Code Counter 32 is incremented to the next available code. Control returns to fetch the next data character to the Current Character register 31 to begin the search for the next longest match in the next compression cycle.

Figure 2:
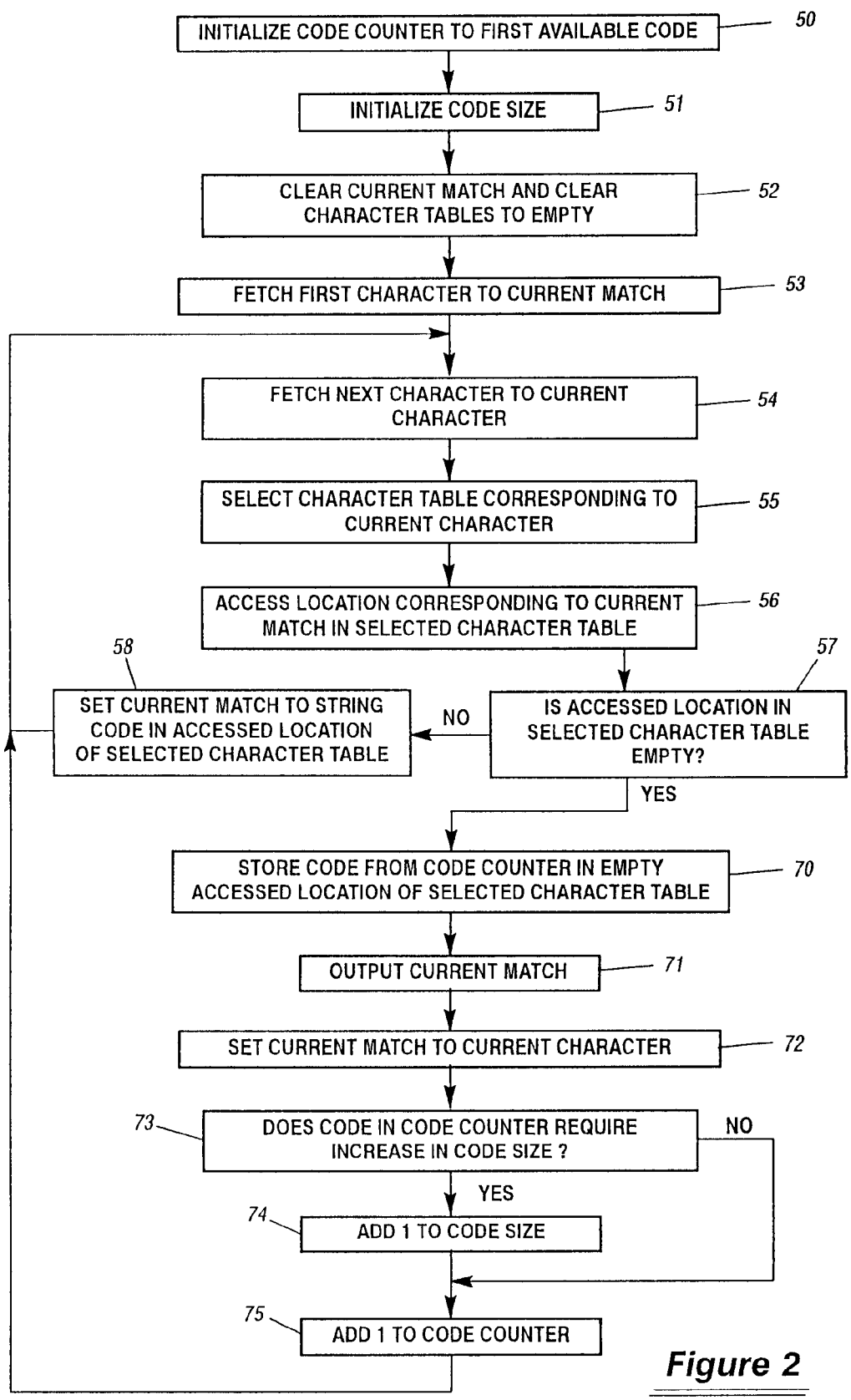
FIG. 2 is a control flow chart illustrating the operations executed by the compressor of FIG. 1 so as to perform data compression in accordance with the present invention.

Referring to FIG. 2, with continued reference to FIG. 1, a control flow chart is illustrated showing the detailed operations to be executed by the compressor 10. The control 35 of the compressor 10 is considered as containing appropriate circuitry, such as state machines, or appropriate software, to control execution of the operations. The flow chart of FIG. 2 is predicated on a variable length output and the Code Size register 33 is utilized to this effect. In an ASCII variable length code implementation, the Code Size may begin with 9 bits and sequentially increase to 10, 11 and 12 bits at codes 512, 1024 and 2048, respectively. It is appreciated that a fixed code size may also be utilized with appropriate modifications to the embodiment.

Control enters a block 50 whereat the Code Counter 32 is initialized to a first available code, for example, 258 in the ASCII environment. At a block 51, the Code Size register 33 is initialized to the beginning Code Size, for example, 9 bits in ASCII embodiments. At a block 52, the Current Match register 30 is cleared and the Character Tables 14–16 are cleared to empty. Zero may be utilized in the locations 20 of the Character Tables to denote the empty state. At a block 53, the first input data character is fetched to the Current Match register 30 and, at a block 54, the next input data character is fetched to the Current Character register 31.

At a block 55, the Character Table 14–16 corresponding to Current Character is selected and, at a block 56, the location corresponding to Current Match in the selected Character Table is accessed via the Indices 21. The Table selection logic 34 is utilized to perform the Table selection. At a block 57, if the accessed location in the selected Character Table is not empty, the NO branch from the block 57 is taken to a block 58. At the block 58, the Current Match register 30 is set to the string code in the accessed location of the selected character table. Thereafter, control returns to the block 54 to fetch the next input data character to the Current Character register 31.

If, at the block 57, the accessed location in the selected Character Table is empty, the YES branch from the block 57 is taken to a block 70. When this occurs, the longest matching string in the Character Table Structure 13 has been determined. At the block 70, the code in the Code Counter 32 is stored in the empty accessed location of the selected Character Table thereby storing the appropriate extended string.

Control proceeds to a block 71 whereat the code of the Current Match is output as part of the compressed code stream provided at the compressor output 12. The code of the Current Match is provided by the Current Match register 30 and is output utilizing the number of bits denoted by the Code Size register 33. When Current Match is a multiple character string, the code of the string resides in the Current Match register 30 and was the longest match found in the Character Table Structure 13 as described above with respect to the block 57. It is appreciated that the Current Match output at the block 71 can also be a single character. The output code in this case is the value of the character which is also provided from the Current Match register 30.

Processing proceeds to a block 72 whereat the character in the Current Character register 31 is set into the Current Match register 30. Thus, the Current Match register 30 is set with the character that resulted in the mismatch at the block 57.

Processing then proceeds to a block 73 whereat the code in the Code Counter 32 is tested to determine if an increase in code size is required. If so, processing continues to a block 74 whereat the Code Size register 33 is incremented by 1. If an increase in Code Size is not required at the block 73, the block 74 is bypassed to continue processing at a block 75. At block 75, the Code Counter 32 is incremented by 1. Control then returns to the block 54 to begin the next compression cycle with the mismatching character set into the Current Match register 30.

It is appreciated from the foregoing that the loop comprising the blocks 54–58 sequentially fetch the input data characters which select the corresponding Character Tables to determine if the strings represented by Current Match are stored in the Character Table Structure. When the YES branch is taken from the block 57, the longest matching string has been determined with the code thereof in the Current Match register and the mismatching character in the Current Character register. The extended string comprising the longest match extended by the mismatching character is readily stored in the Character Table Structure by, at the block 70, inserting the code in the Code Counter into the empty location accessed by Current Match in the Character Table selected by Current Character.

Referring to FIG. 3, with continued reference to FIGS. 1 and 2, an example of the operation of the compressor 10 in accordance with the flow chart of FIG. 2 is illustrated. At the top of FIG. 3, an input data character stream is shown where sequential characters are identified by character sequence numbers. This is done to facilitate following the progress of the characters through the steps of the example. It is appreciated that the sequence numbers are shown for purposes of character identification and do not appear in the actual data character stream.

The example is largely self-explanatory, with the actions performed delineated in the left-hand column and the blocks of FIG. 2 that participate in the actions designated in the right-hand column. The selected Character Table corresponding to Current Character is indicated in the Character Table column with the Current Character value denoted in the Current Character column. The Character Table Indices and the Character Table String Code fields are illustrated in the respective columns as indicated. When, at the block 57 of FIG. 2, an accessed Character Table location is not empty, the string code stored therein is indicated by parenthesis. The Index column of the Character Table indicates, in parenthesis, that the prefix code of the stored string is utilized to index or access the location of the selected Character Table. It is appreciated that the Index is provided by Current Match.

The operational example of FIG. 3 graphically demonstrates the novel data compression implementation architecture of the present invention for storing data character strings, searching the input stream for the longest match with the stored strings and updating the stored strings with an extended string. For example, action 1 illustrates the string "ab" stored in the "b" Character Table with a string code of 258. As described above with respect to FIGS. 1 and 2, the fetched Current Character "b" selects the "b" Character Table which is indexed by the string prefix code "a" (Current Match) and the string code 258 from the Code Counter is stored at the accessed location of the selected Character Table. The string is stored as described at the block 70 of FIG. 2 because at the block 57 the accessed location of the selected Character Tables was determined to be empty.

In action 3, this string "ab" is encountered in the "b" Character Table and, at action 4, is extended in the "a" Character Table which stores the string "aba". As illustrated in action 4, this string is assigned the string code 260 from the Code Counter. In action 3, the string was encountered as being previously stored because, at the block 57, the accessed location in the selected Character Table was not empty. As seen in action 4, the string code 258, indicated in parenthesis in action 3, is set into the Current Match register at the block 58 of FIG. 2.

In the embodiments described herein, when the last input data character has been fetched, the value in the Current Match register 30 is output as the last compressed code. Thus, in action 19, the last character of the exemplified input data character stream is output as illustrated.

More detailed descriptions of the actions of FIG. 3 relative to the blocks of FIG. 2 are readily apparent and will not be provided for brevity.

Figure 4:
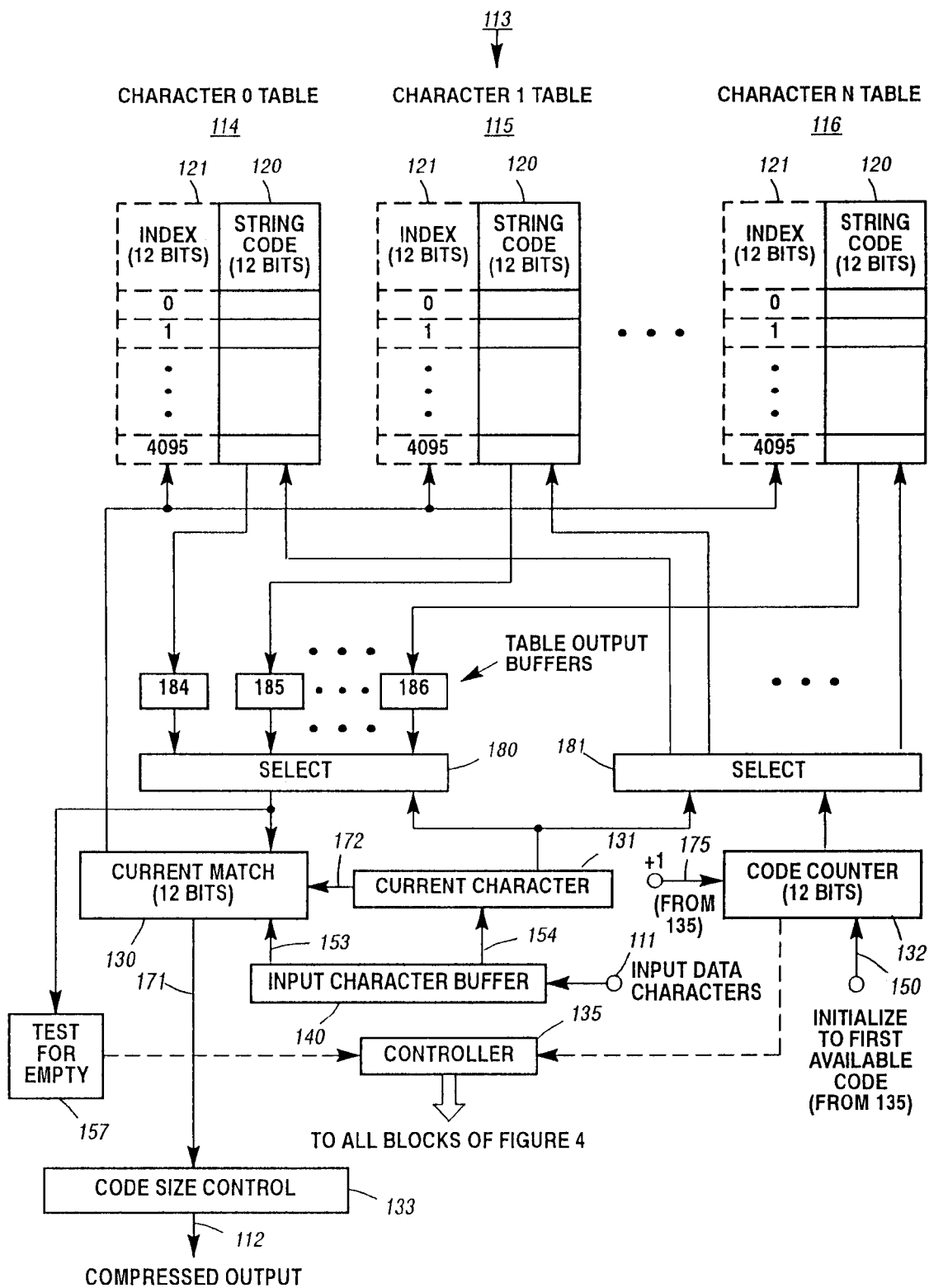
FIG. 4 is a schematic block diagram of an alternative embodiment of a data compressor for compressing data in accordance with the present invention. The data compressor of FIG. 4 is particularly suitable for implementation as a hardware embodiment.

Referring to FIG. 4, with continued reference to FIGS. 1–3, an alternative best mode embodiment of the data compressor of the present invention is illustrated. The embodiment of FIG. 4 is particularly suitable for hardware implementation. Many of the components of the FIG. 4 embodiment correspond to components of the FIG. 1 embodiment and are provided with reference numerals that are greater by 100 than the reference numerals of the corresponding components of FIG. 1. Additionally, further components of FIG. 4 correspond to blocks of FIG. 2 and are provided with reference numerals that are also greater by 100 than the reference numerals of the corresponding blocks of FIG. 2. The descriptions given above with respect to FIGS. 1 and 2 also apply to the structure and operation of these components in FIG. 4. In addition, the compressor of FIG. 4 includes select circuits 180 and 181 as well as Table Output Buffers 184–186.

Although the structural and functional descriptions given above with respect to FIGS. 1 and 2 also apply to the structure and operation of the compressor of FIG. 4, a significant additional feature is included in the compressor of FIG. 4 for selecting a Character Table 114–116 in accordance with Current Character in the Current Character register 131. In the compressor of FIG. 4, the Current Match in Current Match register 130 simultaneously accesses the Character Tables 114–116 via the Indices 121. Current Character in the Current Character register 131 selects the appropriate accessed string code output via the select circuit 180. The string code outputs from the Character Tables 114–116 are buffered in the Table Output Buffers 184–186, respectively.

Similarly, the Current Character in Current Character register 131 selects, via the select circuit 181, the Character Table 114–116 into which to store the code in the Code Counter 132 in the empty location accessed by Current Match in the Current Match register 130.

The step by step operation of the compressor of FIG. 4 is as follows. The controller 135, which is responsive to the Code Counter 132 and to the detector 157, which tests the selected Character Table location for the empty status, provides control inputs to all of the blocks of FIG. 4 to control the operations thereof. The controller 135 may include state machines to sequence through the operations. Initially, the Code Counter 132 is initialized to the first available code via control input 150, the Current Match register 130 is cleared, and the Character Tables 114–116 are cleared to the empty state.

In the first compression cycle, the first input data character is fetched from the Input Character Buffer 140 to the Current Match register 130 via bus 153 and the next input data character is fetched, via bus 154, to the Current Character register 131. In a subsequent compression cycle, the Current Match register 130 is set to contain the mismatching character determined from the preceding compression cycle by transferring Current Character from the Current Character register 131 to the Current Match register 130 via the bus 172.

At the beginning of a compression cycle, the next input character is fetched to the Current Character register 131 and Current Match accesses, in parallel, the locations corresponding thereto in the Character Tables 114–116 via the Table Indices 121. The contents of the accessed String Code locations 120 are simultaneously read into the Table Output Buffers 184–186, respectively. The Character Table output corresponding to Current Character is selected by the select circuit 180 and is tested for empty by the detector 157. If the accessed location 120 in the selected Character Table is not empty, the controller 135 enables the select circuit 180 to set the Current Match register 130 to the Character Table String Code output selected by Current Character. The next input data character is then fetched from the Input Character Buffer 140 to the Current Character register 131 via the bus 154. The controller 135 controls the repetition of these operations until the detector 157 indicates that the Character Table location accessed by Current Match and selected by Current Character is empty.

When the accessed location is empty, the code in the Code Counter 132 is directed, by the select circuit 181, for storage in the String Code field of the Character Table selected by Current Character at the accessed location corresponding to Current Match. Thereafter, Current Match is output via the bus 171 utilizing the number of bits determined by the Code Size control 133. The controller 135 controls the Code Size control 133 to select the appropriate Code Size in accordance with the count in the Code Counter 132 in a well known manner.

To prepare for the next compression cycle, the Current Match register 130 is set to the mismatching character in the Current Character register 131, via the bus 172, and the Code Counter 132 is incremented to the next available code via the input 175.

It is appreciated that the operative example of FIG. 3 is also applicable to the FIG. 4 embodiment.

Figure 5:
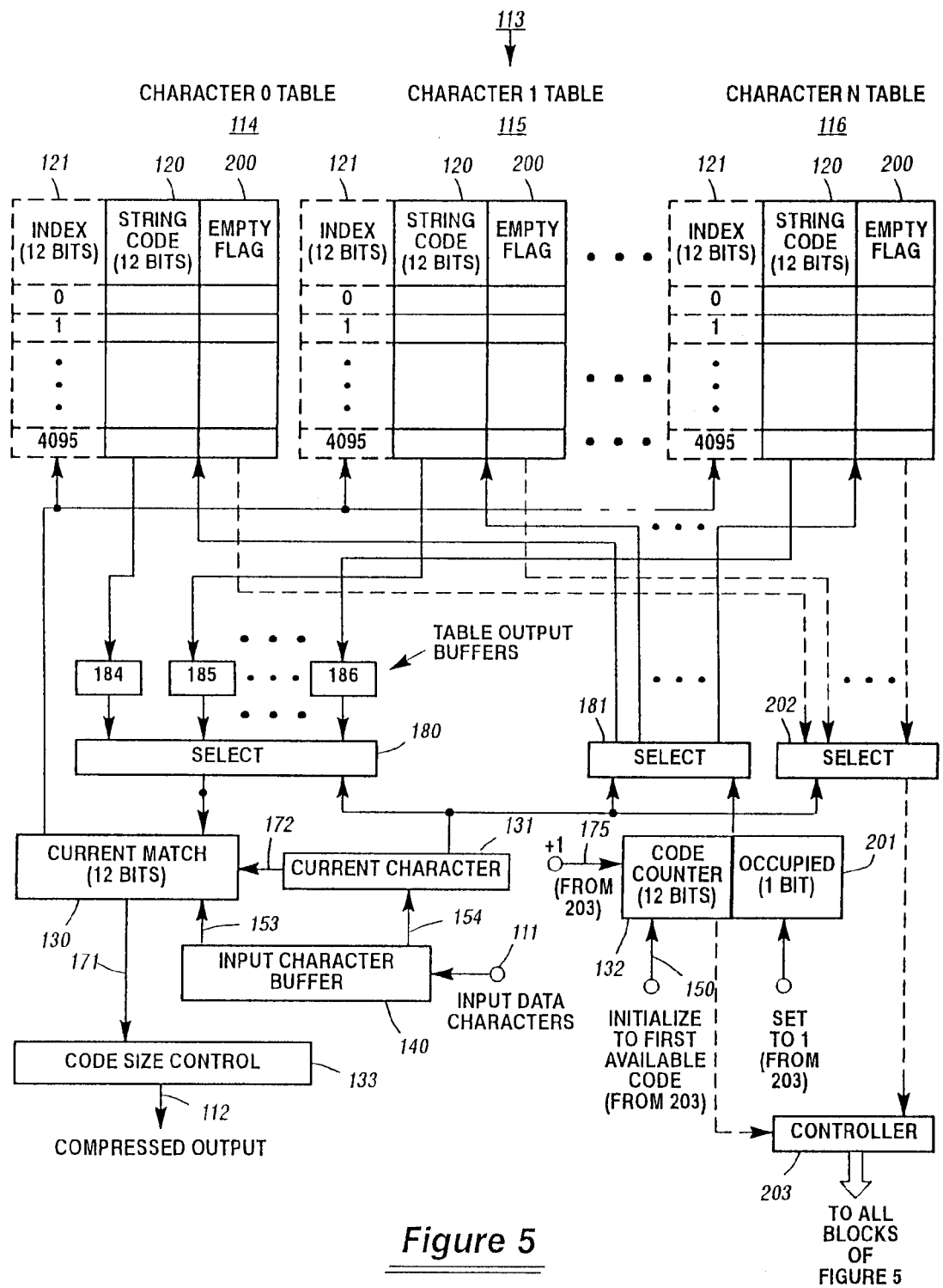
FIG. 5 is a schematic block diagram similar to that of FIG. 4 providing an alternative configuration for determining the empty status of a Character Table location.

Referring to FIG. 5, where like reference numerals indicate like components with respect to FIG. 4 and with continued reference to FIGS. 1–4, an alternative best mode embodiment of the compressor of the present invention is illustrated. The embodiment of FIG. 5 is substantially the same as the embodiment of FIG. 4 and therefore operates as described above with respect to FIG. 4 generally following the flow of operations depicted in FIG. 2. The principle difference between the embodiments of FIGS. 4 and 5 is the manner in which the empty status of a Character Table location is detected. In the FIG. 4 embodiment, the Character Tables were initially cleared to empty by, for example, setting all of the locations 120 to an empty indication such as zero. In the FIG. 5 embodiment, a 1 bit Empty Flag 200 is included with each String Code location 120 in each of the Character Tables 114–116. In the FIG. 5 embodiment, it is only necessary to reset the Empty Flag 200 at each Character Table location in order to initialize the Character Tables to empty.

The Code Counter 132 includes a 1 bit extension 201 which is set to 1 so as to indicate the occupied status of a Character Table location. When an extended string is stored in the Character Table Structure 113, as described above, not only is the code in the Code Counter 132 written into the accessed location of the selected Character Table, as previously described, but the bit 201 is also written into the associated Empty Flag 200 setting the Flag to "occupied". The Character Table is selected by the select circuit 181 and the appropriate location therein accessed by the Current Match register 130 as described above.

In the FIG. 5 embodiment, the test for empty at the block 57 of FIG. 2, is now performed by a select circuit 202 coupled to the Current Character register 131. The select circuit 202 selects the Empty Flag 200 associated with the Character Table location accessed by Current Match from the Character Table selected by Current Character. The select circuit 202 provides an input to controller 203 so as to effect the empty test and control the resulting operations as described above. It is appreciated that the controller 203 performs the functions of the controller 135 described above with respect to FIG. 4. It is further appreciated that the operational example of FIG. 3 also applies to the FIG. 5 embodiment.

As discussed above with respect to FIGS. 4 and 5, the Current Match register 130 is set to Current Character toward the end of a compression cycle thereby simultaneously accessing the Indices 121 of all of the Character Tables 114–116. The contents of the accessed Character Table locations are simultaneously read from the Tables into the Table Output Buffers 184–186. Thus, at the beginning of a compression cycle, the appropriate values from the accessed String Code locations 120 reside in the Table Output Buffers 184–186 ready for selection via the select circuit 180 when Current Character is fetched into the Current Character register 131 at the beginning of the cycle. The compressors of FIGS. 4 and 5 are not required to wait for Character Table selection and Character Table read-out after Current Character is fetched. It is believed that this arrangement will effect an even further enhancement of compressor speed.

Figure 6:
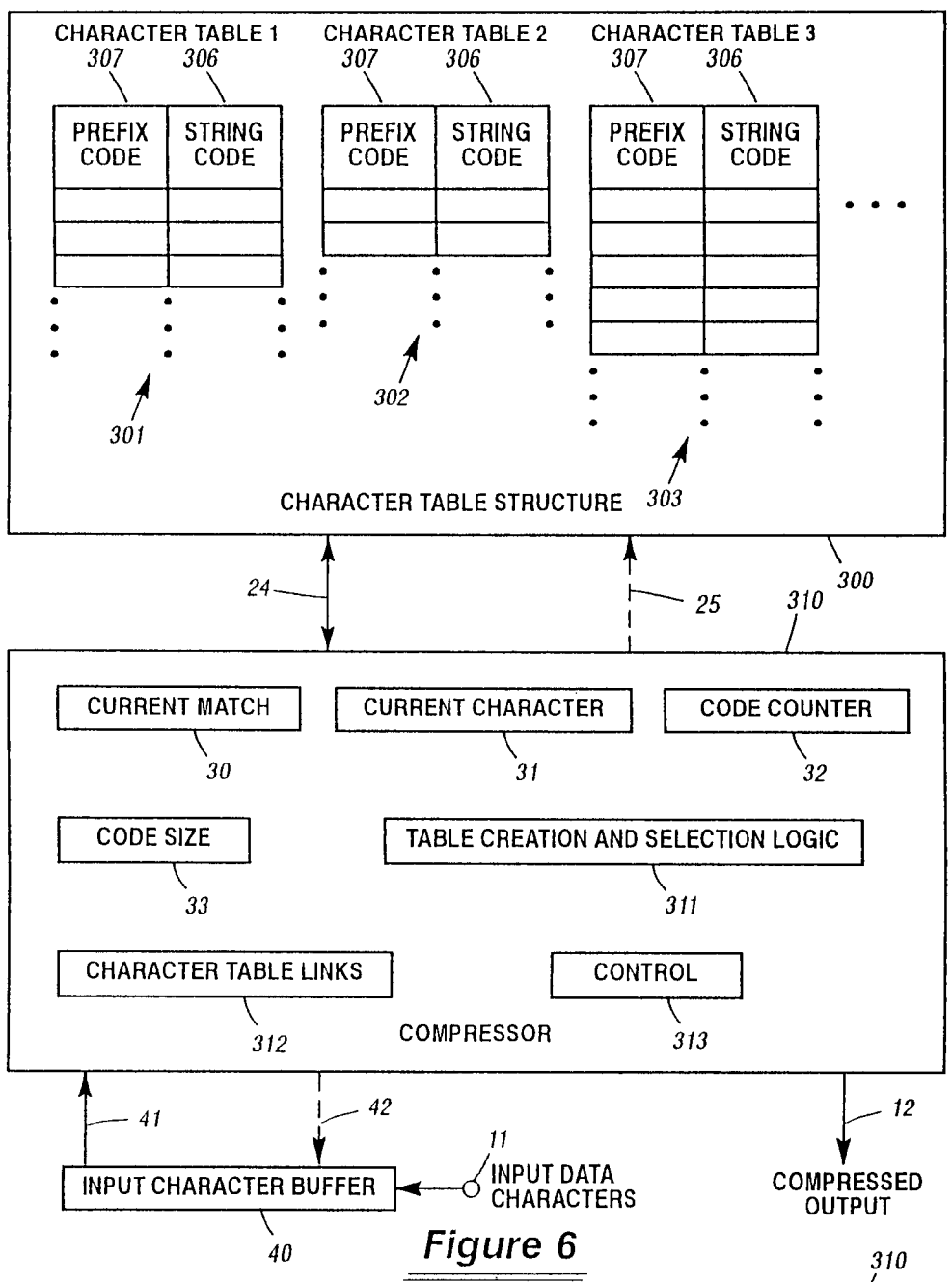
FIG. 6 is a schematic block diagram of an alternative embodiment of a data compressor for compressing data in accordance with the present invention. In the embodiment of FIG. 6, the Character Tables and the locations thereof are established when required. The data compressor of FIG. 6 is particularly suitable for implementation as a software embodiment.

Referring to FIG. 6, in which like reference numerals indicate like components with respect to FIG. 1 and with continued reference to FIGS. 1–3, an alternative best mode embodiment of the data compressor of the present invention is illustrated. Although the embodiment of FIG. 6 is configured and operates in a manner similar to that described above with respect to FIGS. 1 and 2, the FIG. 6 embodiment includes significant additional features that provide further enhancements.

The embodiment of FIGS. 1 and 2, as well as the embodiments of FIGS. 4 and 5, utilize pre-established Character Tables as described. In the FIG. 6 embodiment, a Character Table is established when the character corresponding thereto is first encountered in the input. As a further feature, a location in a Character Table is established when the location is required in which to store the above described extended string. By utilizing these additional features, only Character Table memory actually utilized by the operation of the compressor is required.

Accordingly, the FIG. 6 embodiment includes Character Table Structure 300 illustrating Character Tables 301–303. Each Character Table 301–303 is established when the input data character corresponding thereto is first encountered in the Current Character register 31. In order to facilitate implementation of the additional features of the FIG. 6 embodiment, a Character Table 301–303 includes a location 306 in which to store the code of a string and a corresponding location in which to store the code of the prefix of the string. The stored Prefix Codes provide a Prefix Code List 307 with which to index and access the corresponding String Codes 306.

The embodiment of FIG. 6 includes compressor 310 comprising the previously described Current Match register 30, the Current Character register 31, the Code Counter 32 and the Code Size register 33. In addition, the compressor 310 includes table creation and selection logic 311 and Character Table Links 312 utilized in the "on-the-fly" creation of the Character Table Structure 300. The Character Table Links 312 may be configured as a directory indexed by the individual characters of the alphabet to provide a respective address link to the corresponding Character Table in the Character Table Structure 300. If a link is not stored for an input data character, the Character Table for that character has not yet been established. When an input data character is first encountered by the compressor 310 and fetched into the Current Character register 31, the logic 311 selects an address link for storage in the directory 312 to correspond to the newly encountered character. The logic 311 then creates the Character Table linked by this address so as to provide the Character Table corresponding to the character.

Figure 7:
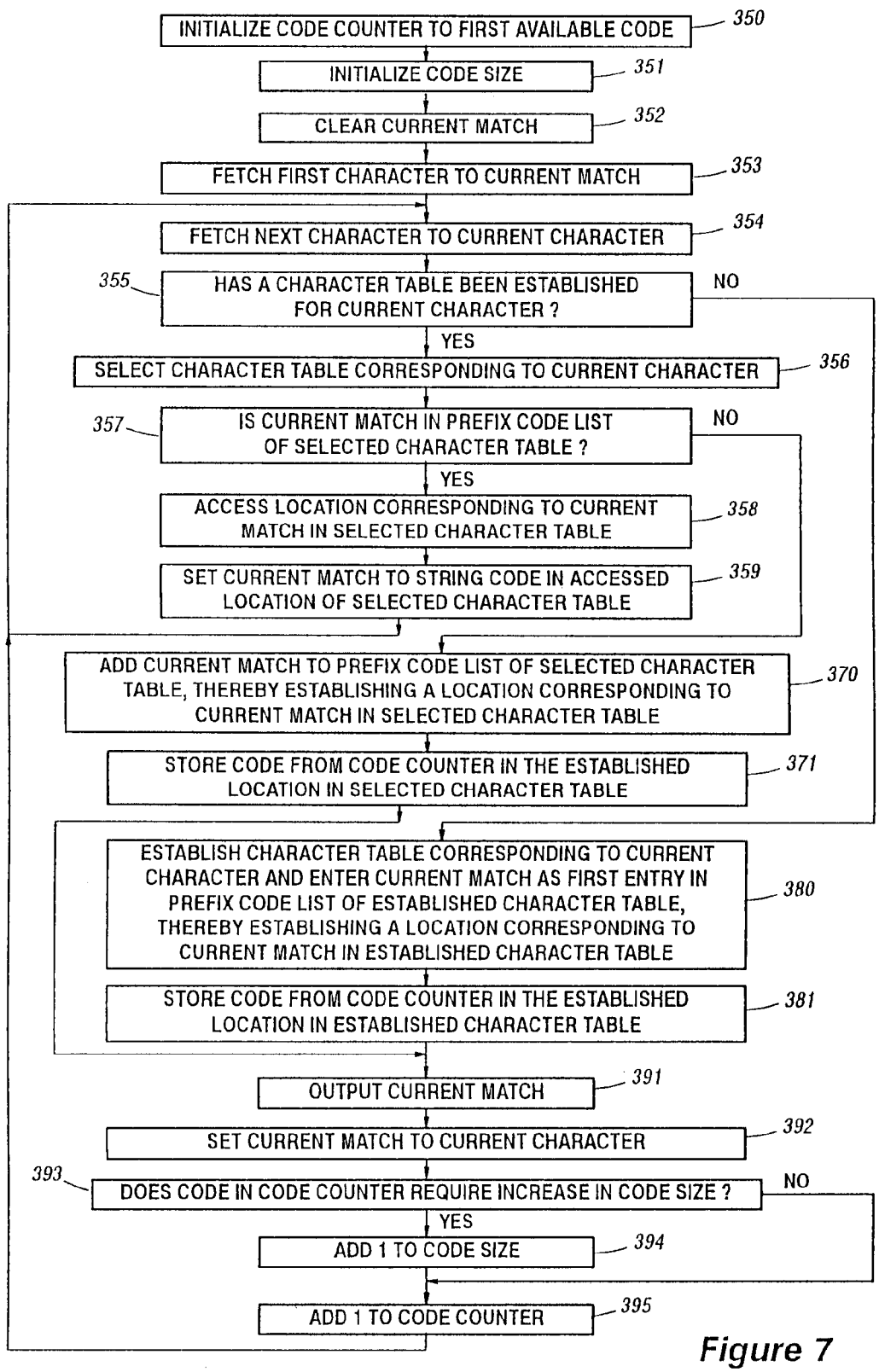
FIG. 7 is a control flow chart illustrating the operations executed by the compressor of FIG. 6 so as to perform data compression in accordance with the present invention.

The compressor 310 additionally includes control 313 for controlling the operations of the compressor 310 in accordance with the operational flow chart of FIG. 7.

Referring to FIG. 7, with continued reference to FIGS. 1, 2 and 6, a control flow chart is illustrated showing the detailed operations to be executed by the compressor 310. The control 313 of the compressor 310 is considered as containing appropriate circuitry, such as state machines, or appropriate software, to control execution of the operations. The flow chart of FIG. 7 is predicated on a variable length output in the manner described above with respect to FIG. 2. The descriptions given above with respect to FIG. 2 apply, where applicable, to the flow chart of FIG. 7.

Control enters blocks 350–354 to perform functions similar to those described above with respect to blocks 50–54, respectively, of FIG. 2. It is noted at block 352 that the Current Match register is cleared. The Character Tables that were cleared at block 52 of FIG. 2 are not as yet established in the FIG. 6 embodiment.

At a block 355, the compressor 310 determines if a Character Table has been established for Current Character. The Character Table Links 312 are consulted to effect this determination. If at the block 355, a Character Table has been established for Current Character, the YES branch is taken from the block 355 to a block 356. At the block 356, the Character Table corresponding to Current Character is selected utilizing the table creation and selection logic 311.

At a block 357, the Current Match is compared to the Prefix Code List 307 of the selected Character Table to determine if Current Match is in the Prefix Code List. The Prefix Code List may be searched associatively for Current Match or, alternatively, the Prefix Code List may comprise an ordered and linked list of Prefix Codes so as to effect the comparison with Current Match. Other list searching procedures known in the art may be utilized to the same effect. If Current Match is found in the Prefix Code List, the YES branch is taken from the block 357 to a block 358.

At the block 358, the location corresponding to Current Match in the selected Character Table is accessed and, at a block 359, the Current Match register 30 is set to the string code in the accessed location of the selected Character Table. Control then returns to the block 354 to fetch the next character to the Current Character register 31 to continue the search for the longest match.

It is appreciated that the loop comprised of the blocks 354–359 searches for the longest matching string in the Character Table Structure 300 generally as described above with respect to the blocks 54–58 of FIG. 2. In the FIG. 6 embodiment, when Current Match is found in the Prefix Code List at the block 357, the longest match is not yet determined. When, however, at the block 357, Current Match is not in the Prefix Code List of the selected Character Table, the longest match has been determined and the NO branch from the block 357 is taken to a block 370.

Accordingly, at the block 370, Current Match in the Current Match register 30 is added to the Prefix Code List 307 of the selected Character Table. Thus, at the block 370, a location is established in the selected Character Table that corresponds to Current Match. If the Prefix Code List comprises an ordered and linked list, the Current Match is inserted and linked into the Prefix Code List in the appropriate order. At a block 371, the code from the Code Counter 32 is stored in the String Code field at the location in the selected Character Table that was established at the block 370. It is appreciated that the block 371 of FIG. 6 corresponds to the block 70 of FIG. 2 in the operational flow whereat the appropriate extended string is stored.

Control proceeds from the block 371 to blocks 391–395 whereat the functions described above with respect to blocks 71–75 of FIG. 2 are performed. After executing the function of block 395, control returns to the block 354 to fetch the next input character to the Current Character register 31 to begin the next compression cycle.

If, at the block 355, a Character Table has not been established for Current Character, the NO branch from the block 355 is taken to a block 380. At the block 380 a Character Table corresponding to Current Character is established and Current Match is entered as the first entry in the Prefix Code List 307 of the established Character Table. This first entry thereby establishes a String Code location 306 corresponding to Current Match in the established Character Table. The table creation and selection logic 311 and the Character Table Links 312 are utilized, as described above, in establishing the Character Table.

At a block 381, the code from the Code Counter 32 is stored in the established String Code location 306 in the established Character Table. Thus the appropriate extended string is stored, as in the block 371, in the manner described above with respect to the block 70 of FIG. 2. Control then proceeds to the blocks 391–395 as previously described.

It is appreciated that the operative example of FIG. 3 is also applicable to the FIG. 6 embodiment.

Although the FIG. 6 embodiment was described in terms of "on-the-fly" creation of the Character Tables as well as of the locations thereof, it is appreciated that these features can also be used separately. If the Character Table establishing feature is separately utilized, a complete Character Table, as illustrated in FIG. 1, may be established and indexed in the manner described above with respect to FIG. 1. In such an embodiment, Character Table locations would be tested for the empty status as described with respect to block 57 of FIG. 2 rather than utilizing the Prefix Code List as described with respect to FIGS. 6 and 7.

If the Character Table location establishing feature is separately utilized, the Character Table links of FIG. 6 would not be used as described. Instead, pre-established Character Tables with Prefix Code Lists would be utilized.

Figure 8:
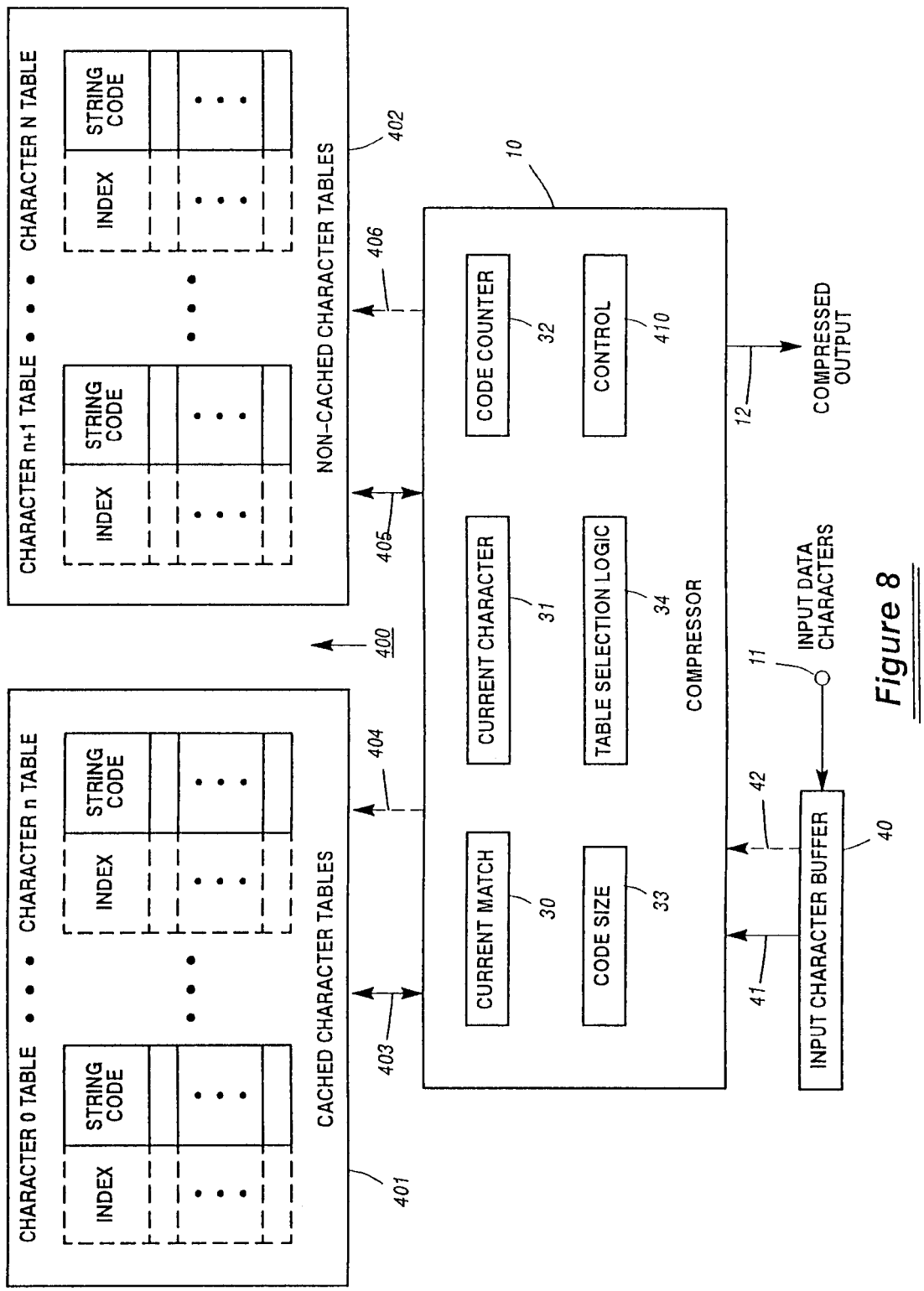
FIG. 8 is a schematic block diagram similar to that of FIG. 1 with frequently selected Character Tables stored in cache memory.

Referring to FIG. 8, in which like reference numerals indicate like components with respect to FIG. 1 and with continued reference to FIGS. 1–3, an alternative best mode embodiment of the data compressor of the present invention is illustrated. The FIG. 8 embodiment is substantially the same as the FIG. 1 embodiment except that the Character Table Structure is segregated into cached Character Tables and non-cached Character Tables.

Accordingly, a Character Table Structure 400 is comprised of a cached section 401 and a non-cached section 402. Data is communicated between the compressor 10 and the cached Character Tables 401 via a bi-directional data bus 403 under control of a control bus 404. Data is communicated between the compressor 10 and the non-cached Character Tables 402 via a bi-directional data bus 405 under control of a control bus 406.

The compressor 10 includes control 410 for controlling the execution of the operations to be performed by the FIG. 8 embodiment in a manner similar to that described above with respect to FIGS. 1 and 2. In addition, control 410 controls the operations performed with respect to the cached and non-cached sections 401 and 402.

The cached section 401 is implemented by a relatively small fast cache memory of a type well known in the art. The non-cached section 402 may be implemented with a larger and slower memory arrangement. When the FIG. 8 embodiment is utilized to compress data from a body of data of a genre where the frequency distribution of the alphabet characters are known or determinable, Character Tables corresponding to frequently encountered characters are established in the cached section 401 while Character Tables corresponding to the infrequently encountered characters are established in the non-cached section 402. It is believed that an overall speed improvement will be effected by this arrangement.

The embodiment of FIG. 8 can be made automatically and dynamically configurable by providing automatic statistical analysis of the input data and providing logic in the compressor 10 for automatically and dynamically maintaining Character Tables in the cached section 401 corresponding to those characters of the alphabet that are dynamically found to be frequently occurring.

It is appreciated that the operative example of FIG. 3 is also applicable to the FIG. 8 embodiment.

Figure 9:
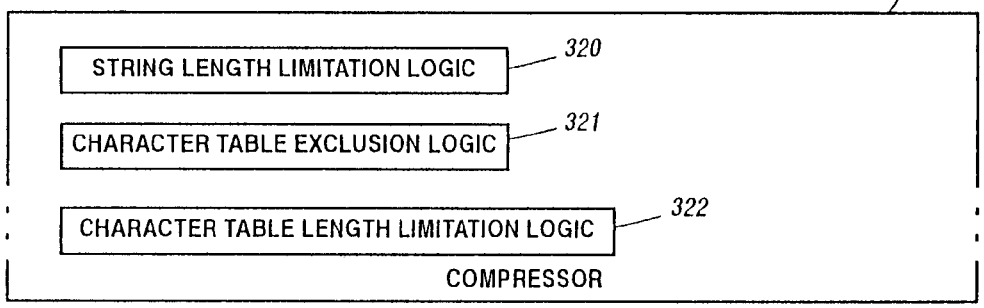
FIG. 9 is a schematic block diagram illustrating optional features for inclusion in the embodiments of the invention described herein.

Referring to FIG. 9, with continued reference to FIGS. 6 and 7, additions to the compressor 310 of FIG. 6 are schematically depicted for controlling further desirable features. Specifically, the compressor 310 of FIG. 9 includes string length limitation logic 320, Character Table exclusion logic 321 and Character Table length limitation logic 322.

The string length limitation logic 320 limits the length of the string that is stored in the Character Table Structure 300 of FIG. 6. Appropriate character counting logic is included in the logic 320 for maintaining a count of the characters fetched at the block 354 of FIG. 7. When the length of the input string being searched exceeds the string length limit, the blocks 391–395 of FIG. 7 are executed without storing the extended string. The string length limitation logic 320 is utilized to exclude from storage excessively long strings that are not likely to reoccur.

The Character Table exclusion logic 321 is utilized to exclude creation of Character Tables corresponding to alphabet characters that are likely to occur infrequently. In this manner a string ending in an extension character that is unlikely to occur will not be stored in the Character Table Structure 300. The logic 321 may be implemented by including functionality in FIG. 7 associated with the block 355 that determines if Current Character is such an infrequently occurring an character. If so, a Character Table corresponding to Current Character is not created and the blocks 391–395 of FIG. 7 are executed to complete the compression cycle. By the use of the logic 321, strings that end in an infrequently occurring character and are thus unlikely to be repeated, are excluded from storage.

The Character Table length limitation logic 322 is utilized to limit the length of the Character Tables 301–303 to respective predetermined numbers of locations. Counters would be included in the logic 322 to be used with the blocks 357 and 370 of FIG. 7. Before a location is established in a Character Table at the block 370 of FIG. 7, the appropriate Character Table location counter is consulted to determine if further space exists in the Character Table before the location is established. If the Character Table length limitation is exceeded, the location is not established and the string is not stored at the block 371. The blocks 391–395 of FIG. 7 are then executed to conclude the compression cycle. The Character Table length limitations may be established on the basis of character frequency of occurrence criteria. Character Tables for frequently occurring characters can be longer than Character Tables for infrequently occurring characters.

Although the features illustrated in FIG. 9 are described with respect to inclusion in the FIG. 6 embodiment, it is appreciated that these features can be included in any of the above described embodiments of the invention.

It is appreciated that the compressed code output provided by each of the embodiments of FIGS. 1–8 is compatible with standard LZW decompressors and the data character stream corresponding to the compressed code output can be recovered thereby. If a feature discussed above with respect to FIG. 9 is included in the compressor, corresponding logic should be utilized at the decompressor.

It is further appreciated that when no further input data characters are available, the above described embodiments will output Current Match to conclude the processing.

The architecture of the present invention is particularly advantageous for use in implementing the LZW compression requirements of GIF. In the GIF protocols, the LZW character size is adjusted to match the size of the data character alphabet over which compression is being performed. Since, for example in the FIG. 6 embodiment, Character Tables are created when the alphabet characters are first encountered, the FIG. 6 embodiment provides automatic adaptation of the LZW process to the alphabet size. It is also advantageous to use the smaller number of Character Tables that would be commensurate with the smaller alphabets often encountered in GIF processing.

It is appreciated from the foregoing that the implementation architecture of the present invention should result in an improvement in compressor speed. The present invention utilizes unambiguous accessing of Character Table locations thereby eliminating the time required for collision resolution in prior art hashing implementations or prior art sibling list searches. Furthermore, the architecture of the present invention is particularly suited to parallel Character Table accessing as described above with respect to FIGS. 4 and 5. It is noted with respect to the embodiments of FIGS. 4 and 5, that the present invention is readily adaptable to hardware implementation thereby benefiting from the speed advantages inherent therein. It is also appreciated that further performance enhancements should be realized because of the implementation simplicity evidenced in the above described embodiments.

Although the above described embodiments of the invention are LZW based, it is appreciated that the architecture of the present invention can be utilized with other known dictionary based compression methodologies. It is furthermore appreciated that since the architecture of the present invention is predicated on Character Tables corresponding to the respective characters of the alphabet, the input data characters can be over any size alphabet having any corresponding character bit size. For example, the data characters can be textual data, image pixel data or bit map data. The input data can also be binary characters over the two-character binary alphabet 1 and 0 having a 1-bit size character.

It is appreciated that the above described embodiments of the invention may be implemented in hardware, firmware, software or a combination thereof. Discrete circuit embodiments may readily be implemented for performing the various described functions. In a software embodiment, appropriate modules programmed with coding readily generated from the above descriptions may be utilized.

While the invention has been described in its preferred embodiments, it is to be understood that the words which have been used are words of description rather than of limitation and that changes may be made within the purview of the appended claims without departing from the true scope and spirit of the invention in its broader aspects.

What is claimed is:

1. A data compression method for compressing an input stream of data characters into an output stream of compressed codes, said data characters being from an alphabet of data characters, comprising providing a plurality of character tables corresponding to characters of said alphabet, respectively, each said character table corresponding to a respective alphabet character, storing, in said character tables, strings of data characters encountered in said input stream, said stored strings having respective codes associated therewith, a string comprising a prefix string of at least one of said characters followed by an extension character, a particular string being stored in said character tables by storing the code associated with said particular string in the character table corresponding to the extension character of said particular string at a character table location corresponding to the code of the prefix string of said particular string, searching said input stream by comparing said input stream to said stored strings to determine the longest match therewith, said searching step including searching for a string in a character table corresponding to the extension character of the string by determining if a location exists corresponding to the code of the prefix of the string in the character table corresponding to the extension character of the string that is storing the code of the string, outputting the code associated with said longest match so as to provide said output stream of compressed codes, and inserting an extended string into said character tables, said extended string comprising said longest match extended by the next data character in said input stream following said longest match, said extended string being stored in the character table corresponding to said next data character.

2. The compression method of claim 1 wherein said searching step includes (a) matching one of said stored strings thereby providing a current match, (b) fetching the next data character from said input stream following said current match thereby providing a current character, (c) determining if the location corresponding to said current match in a character table corresponding to said current character is empty, and (d) if said location is not empty, setting said current match to the code stored in said location and repeating steps (b) through (d) until the location of step (c) is determined to be empty, thereby determining said longest match.

3. The compression method of claim 2 wherein, if said location in step (c) is determined to be empty, said inserting step includes provided a next available string code, and storing said next available string code in said empty location, thereby inserting said extended string into said character table corresponding to said current character.

4. The compression method of claim 2 wherein, if said location in step (c) is determined to be empty, said outputting step comprises outputting said current match.

5. The compression method of claim 3 wherein said compression method operates in compression cycles, further including setting said current match to said current character in preparation for performing a next compression cycle.

6. The compression method of claim 1 wherein said searching step includes (a) matching one of said stored strings thereby providing a current match, (b) fetching the next data character from said input stream following said current match thereby providing a current character, (c) accessing the locations corresponding to said current match in said plurality of character tables so as to provide a plurality of character table outputs corresponding to said accessed locations, respectively, (d) selecting the character table output from said character table corresponding to said current character, (e) determining if said selected character table output is empty, and (f) if said selected character table output is not empty, setting said current match to the code stored in said selected character table output and repeating steps (b) through (f) until the selected character table output of step (e) is determined to be empty, thereby determining said longest match.

7. The compression method of claim 6 wherein, if said selected character table output in step (e) is determined to be empty, said outputting step comprises outputting said current match.

8. The compression method of claim 7 wherein said compression method operates in compression cycles, further including setting said current match to said current character in preparation for performing a next compression cycle.

9. The compression method of claim 6 wherein, if said selected character output in step (e) is determined to be empty, said inserting step includes providing a next available string code, and storing said next available string code in the location corresponding to said current match in said character table corresponding to said current character, thereby inserting said extended string into said character table corresponding to said current character.

10. The compression method of claim 6 wherein said determining step comprises including, at each location of said plurality of character tables, an empty flag representative of the empty status of said each location, selecting the empty flag at the location corresponding to current match in the character table corresponding to current character, and determining if said selected empty flag is representative of the empty status.

11. The compression method of claim 1 further comprising creating a particular character table when the particular character corresponding to said particular character table is first encountered.

12. The compression method of claim 11 further comprising excluding creation of character tables corresponding to infrequently occurring characters of said alphabet.

13. The compression method of claim 1 wherein a character table includes a list of prefix codes corresponding to the respective locations of said character table.

14. The compression method of claim 13 wherein said searching step includes (a) matching one of said stored strings thereby providing a current match, (b) fetching the next data character from said input stream following said current match thereby providing a current character, (c) determining if said current match is one of the prefix codes in the prefix code list of said character table corresponding to said current character, and (d) if said current match is one of said prefix codes, setting said current match to the code stored in the character table location corresponding to said one of said prefix codes and repeating steps (b) through (d) until said current match of step (c) is determined not to be one of said prefix codes in said prefix code list, thereby determining said longest match.

15. The compression method of claim 14 wherein, if in step (c) said current match is determined not to be one of said prefix codes in said prefix code list, said outputting step comprises outputting said current match.

16. The compression method of claim 15 wherein said compression method operates in compression cycles, further including setting said current match to said current character in preparation for performing a next compression cycle.

17. The compression method of claim 13 further comprising limiting the lengths of predetermined character tables to predetermined character table length limits, respectively.

18. The compression method of claim 14 wherein, if in step (c) said current match is determined not to be one of said prefix codes in said prefix code list, said inserting step includes storing said current match in said prefix code list of said character table corresponding to said current character, thereby establishing a location corresponding to said current match in said character table corresponding to said current character, providing a next available string code, and storing said next available string code in said established location, thereby inserting said extended string into said character table corresponding to said current character.

19. The compression method of claim 1 further comprising establishing predetermined ones of said character tables in cache memory.

20. The compression method of claim 1 further comprising establishing character tables corresponding to frequently occurring characters of said alphabet in cache memory.

21. The compression method of claim 1 further comprising
limiting strings stored in said character tables to a predetermined number of characters less than a predetermined string length limit.

22. Data compression apparatus for compressing an input stream of data characters into an output stream of compressed codes, said data characters being from an alphabet of data characters, comprising
a plurality of character tables corresponding to characters of said alphabet, respectively, for storing strings of data characters encountered in said input stream, each said character table corresponding to a respective alphabet character, said stored strings having respective codes associated therewith, a string comprising a prefix string of at least one of said characters followed by an extension character,
a particular string being stored in said character tables by storing the code associated with said particular string in the character table corresponding to the extension character of said particular string at a character table location corresponding to the code of the prefix string of said particular string,
means for searching said input stream by comparing said input stream to said stored strings to determine the longest match therewith,
said searching means including means for searching for a string in a character table corresponding to the extension character of the string by determining if a location exists corresponding to the code of the prefix of the string in the character table corresponding to the extension character of the string that is storing the code of the string,
means for outputting the code associated with said longest match so as to provide said output stream of compressed codes, and
means for inserting an extended string into said character tables, said extended string comprising said longest match extended by the next data character in said input stream following said longest match, said extended string being stored in the character table corresponding to said next data character.

23. The compression apparatus of claim 22 wherein said searching means comprises means operative for
(a) matching one of said stored strings thereby providing a current match,
(b) fetching the next data character from said input stream following said current match thereby providing a current character,
(c) determining if the location corresponding to said current match in a character table corresponding to said current character is empty, and
(d) if said location is not empty, setting said current match to the code stored in said location and repeating (b) through (d) until the location of (c) is determined to be empty, thereby determining said longest match.

24. The compression apparatus of claim 23 wherein said outputting means comprises means for outputting said current match.

25. The compression apparatus of claim 24 wherein said compression apparatus operates in compression cycles, further including
means for setting said current match to said current character in preparation for performing a next compression cycle.

26. The compression apparatus of claim 23 wherein said inserting means includes
means for providing a next available string code, and
means for storing said next available string code in said empty location,
thereby inserting said extended string into said character table corresponding to said current character.

27. The compression apparatus of claim 22 wherein said searching means comprises means operative for
(a) matching one of said stored strings thereby providing a current match,
(b) fetching the next data character from said input stream following said current match thereby providing a current character,
(c) accessing the locations corresponding to said current match in said plurality of character tables so as to provide a plurality of character table outputs corresponding to said accessed locations, respectively,
(d) selecting the character table output from said character table corresponding to said current character,
(e) determining if said selected character table output is empty, and
(f) if said selected character table output is not empty, setting said current match to the code stored in said selected character table output and repeating (b) through (f) until the selected character table output of (e) is determined to be empty, thereby determining said longest match.

28. The compression apparatus of claim 27 wherein said outputting means comprises means for outputting said current match.

29. The compression apparatus of claim 28 wherein said compression apparatus operates in compression cycles, further including
means for setting said current match to said current character in preparation for performing a next compression cycle.

30. The compression apparatus of claim 27 wherein said inserting means includes
means for providing a next available string code, and
means for storing said next available string code in the location corresponding to said current match in said character table corresponding to said current character,
thereby inserting said extended string into said character table corresponding to said current character.

31. The compression apparatus of claim 27 further comprising an empty flag included at each location of said plurality of character tables representative of the empty status of said each location,
said searching means being operative for determining if said selected character table output is empty by selecting the empty flag at the location corresponding to current match in the character table corresponding to current character and determining if said selected empty flag is representative of the empty status.

32. The compression apparatus of claim 22 further comprising
means for creating a particular character table when the particular character corresponding to said particular character table is first encountered.

33. The compression apparatus of claim 32 further comprising
means for excluding creation of character tables corresponding to infrequently occurring characters of said alphabet.

34. The compression apparatus of claim 22 wherein character table includes a list of prefix codes corresponding to the respective locations of said character table.

35. The compression apparatus of claim 34 wherein said searching means comprises means operative for
   (a) matching one of said stored strings thereby providing a current match,
   (b) fetching the next data character from said input stream following said current match thereby providing a current character,
   (c) determining if said current match is one of the prefix codes in the prefix code list of said character table corresponding to said current character, and
   (d) if said current match is one of said prefix codes, setting said current match to the code stored in the character table location corresponding to said one of said prefix codes and repeating (b) through (d) until said current match of (c) is determined not to be one of said prefix codes in said prefix code list,
   thereby determining said longest match.

36. The compression apparatus of claim 35 wherein said outputting means comprises means for outputting said current match.

37. The compression apparatus of claim 36 wherein said compression apparatus operates in compression cycles, further including
   means for setting said current match to said current character in preparation for performing a next compression cycle.

38. The compression apparatus of claim 34 further comprising
   means for limiting the lengths of predetermined character tables to predetermined character table length limits, respectively.

39. The compression apparatus of claim 35 wherein said inserting means includes
   means for storing said current match in said prefix code list of said character table corresponding to said current character, thereby establishing a location corresponding to said current match in said character table corresponding to said current character,
   means for providing a next available string code, and
   means for storing said next available string code in said established location,
   thereby inserting said extended string into said character table corresponding to said current character.

40. The compression apparatus of claim 22 further comprising cache memory for storing predetermined ones of said character tables.

41. The compression apparatus of claim 22 further comprising cache memory for storing character tables corresponding to frequently occurring characters of said alphabet.

42. The compression apparatus of claim 22 further comprising
   means for limiting strings stored in said character tables to a predetermined number of characters less than a predetermined string length limit.

* * * * *